United States Patent [19]

Chan

[11] Patent Number: 5,317,285

[45] Date of Patent: May 31, 1994

[54] FREQUENCY SYNTHESIZER EMPLOYING A CONTINUOUSLY ADAPTIVE PHASE DETECTOR AND METHOD

[75] Inventor: Yiu-Kwong Chan, Surrey, Canada

[73] Assignee: Motorola, Inc., Schaumburg, Ill.

[21] Appl. No.: 23,839

[22] Filed: Feb. 26, 1993

[51] Int. Cl.⁵ .............................................. H04B 3/10
[52] U.S. Cl. ........................................ 331/16; 331/25
[58] Field of Search .................. 331/1 A, 16, 25, 17, 331/2, 4, 8

[56] References Cited

U.S. PATENT DOCUMENTS

| | | | |
|---|---|---|---|
| 3,826,994 | 7/1994 | Holliday | 331/11 |
| 4,194,151 | 3/1980 | Gregerson et al. | 331/2 |
| 4,536,718 | 8/1985 | Underhill | 331/16 |
| 4,546,329 | 10/1985 | Unger | 331/16 |
| 4,614,917 | 9/1986 | Zelitzki | 331/1 A |
| 4,785,260 | 11/1988 | Paneth | 331/2 |
| 4,885,553 | 12/1989 | Hietala et al. | 331/17 |
| 4,943,787 | 7/1990 | Swapp | 331/2 |
| 4,963,838 | 10/1990 | Hareyama | 331/2 |
| 4,994,762 | 2/1991 | Tay | 331/2 |
| 5,038,115 | 8/1991 | Myers et al. | 331/2 |
| 5,128,632 | 7/1992 | Erhart et al. | 331/1 A |
| 5,142,247 | 8/1992 | Lada, Jr. et al. | 331/14 |
| 5,266,907 | 11/1993 | Dacus | 331/1 A |
| 5,270,669 | 12/1993 | Jokura | 331/2 |

Primary Examiner—Raymond A. Nelli
Attorney, Agent, or Firm—Charles W. Bethards

[57] ABSTRACT

A frequency synthesizer (51) arranged in a phase locked loop fashion to provide an output signal with a preselected frequency within a controlled lock time from a voltage controlled oscillator (51), having: a phase detector (55) with a controllable gain, that provides an error signal proportional to the controllable gain and corresponding to a phase difference between a reference signal and a feedback signal, an adapt circuit (121) for setting the controllable gain to an adapt value (205), and a tracking circuit (123) for setting the controllable gain to a tracking value (207) by adjusting the controllable gain in a predetermined and controlled fashion from the adapt value (205) to the tracking value (207).

20 Claims, 3 Drawing Sheets

FREQUENCY SYNTHESIZER EMPLOYING A CONTINUOUSLY ADAPTIVE PHASE DETECTOR AND METHOD

FIELD OF THE INVENTION

This disclosure relates generally to communications receivers and more particularly but not limited to such receivers including frequency synthesizers employing continuously adaptive phase detectors.

BACKGROUND OF THE INVENTION

Communications receivers and transmitters that operate on multiple frequencies may be required to switch from one to a second such frequency. This switching of frequencies ordinarily entails reprogramming some form of a frequency synthesizer and waiting for such synthesizer to re-acquire frequency lock on the new frequency. In more advanced systems and applications such as scanning or packet data or TDMA or frequency hopped spread spectrum systems the length of time required to re-acquire or initially acquire lock is critical with premiums being placed on shorter lock acquisition times.

At the same time the dynamics of phase lock loop based frequency synthesizers entail a trade off or compromise between the time required for acquiring lock (lock time) and other loop characteristics such as a noise spectral density about the synthesized frequency. Generally, other things being equal a shorter lock time results in a higher noise spectral density. In numerous applications this higher noise spectral density may be considered unacceptable. Therefore practitioners have used adaptive phase locked loops of various configurations. Adaptation has often taken one of or a combination of two forms including either a two state loop bandwidth or loop gain. The broad bandwidth or high gain state is used until the phase locked loop has achieved a certain degree of lock acquisition followed by a switch to a narrower bandwidth or lower loop gain. This approach helps achieve a short lock time and an acceptable noise spectral density.

However, switching between bandwidths or switching between gains tends to generate discontinuities within the phase locked loop. Adding insult to injury, these discontinuities must be eliminated (tracked out) by the phase locked loop while such loop is in it's slowest response, i.e. low gain or narrow bandwidth, mode. Avoiding these discontinuities has been attempted in a switched bandwidth type adaptive phase locked loop frequency synthesizer but at the cost of excessive complexity and/or introduction of other potential noise sources. Therefore a clear need exists for a readily implemented phase locked loop frequency synthesizer that exhibits a fast lock time and acceptable noise characteristics.

SUMMARY OF THE INVENTION

These needs and others are resolved by disclosing a frequency synthesizer that is arranged in a phase locked loop fashion to provide an output signal with a preselected frequency within a controlled lock time from a voltage controlled oscillator. This frequency synthesizer includes a phase detector having a controllable gain, for providing an error signal that is proportional to the controllable gain and that further corresponds to a phase difference between a reference signal and a feedback signal. The error signal as processed determines the preselected frequency of the voltage controlled oscillator and the feedback signal corresponds to the preselected frequency. Additionally included is an adapt circuit, coupled to the phase detector, for setting the controllable gain to an adapt value and a tracking circuit, coupled to the phase detector means, for setting the controllable gain to a tracking value by adjusting the controllable gain in a predetermined and controlled fashion from the adapt value to the tracking value.

Also disclosed is a communications receiver arranged to receive radio signals within a controlled time, including a receiver for mixing a radio signal and a local oscillator signal to provide a received signal when said local oscillator signal has a preselected frequency. The local oscillator signal is provided by a frequency synthesizer similar to above. Further a method for use in a frequency synthesizer arranged in a phase locked loop fashion to provide an output signal with a preselected frequency within a controlled lock time from a voltage controlled oscillator is shown. The method includes the steps of; providing an error signal that is proportional to a controllable gain and that corresponds to a phase difference between a reference signal and a feedback signal. The error signal as processed determines the preselected frequency of the voltage controlled oscillator and the feedback signal corresponds to the preselected frequency. Additional steps include setting the controllable gain to an adapt value and setting the controllable gain to a tracking value by adjusting the controllable gain in a predetermined and controlled fashion from the adapt value to the tracking value.

BRIEF DESCRIPTIONS OF THE DRAWINGS

The features of the present invention which are believed to be novel are set forth with particularity in the appended claims. The invention, itself, however together with further advantages thereof, may best be understood by reference to the accompanying drawings in which:

DETAILED DESCRIPTION OF A PREFERRED EMBODIMENT

Figure 1:
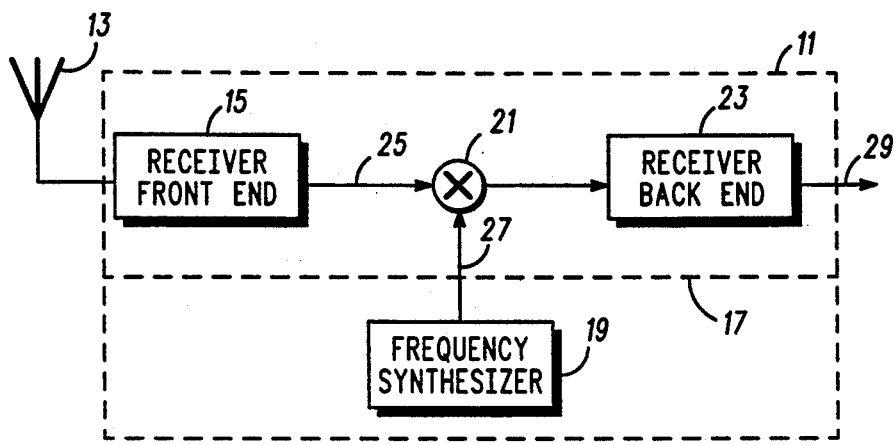
FIG. 1 is a block diagram of a communications receiver constructed in accordance with one embodiment of the present invention.

FIG. 1 depicts a communications receiver (11) coupled to an antenna (13) at a receiver front end (15). The communications receiver (11) includes a receiver (17) and a frequency synthesizer (synthesizer) (19), together, arranged to receive radio signals within a controlled time. The receiver (17) includes, in combination, the receiver front end (15), further having, for example, RF amplification, preselectors, and matching circuitry, a mixer (21), coupled to the receiver front end (15), and, coupled to the mixer (21), a receiver backend (23), having, for example, IF amplification, IF filtering, and modulation detection circuits. The receiver (17) mixes a radio signal, provided by the receiver frontend (15) at mixer input (25), and a local oscillator signal, provided by the synthesizer (19) at mixer input (27), to provide a IF signal to the receiver backend (23) and hence a received signal at receiver output (29) when the local oscillator signal has a preselected frequency.

This preselected frequency is chosen such that the frequency of a desired radio signal when mixed with this preselected frequency will equal a fixed backend frequency. Technical difficulties, such as filtering and other processing complexities associated with the receiver backend (23) ordinarily necessitate that it operate on one fixed signal frequency or a small number of such signal frequencies. Thus the communications receiver (11) may not provide the received signal until the local oscillator signal has substantially acquired the preselected frequency. This is facilitated by the synthesizer (19) providing a local oscillator signal within a controlled lock time as further described below with reference to the FIG. 2 frequency synthesizer wherein like reference numerals indicate like functions.

Figure 2:
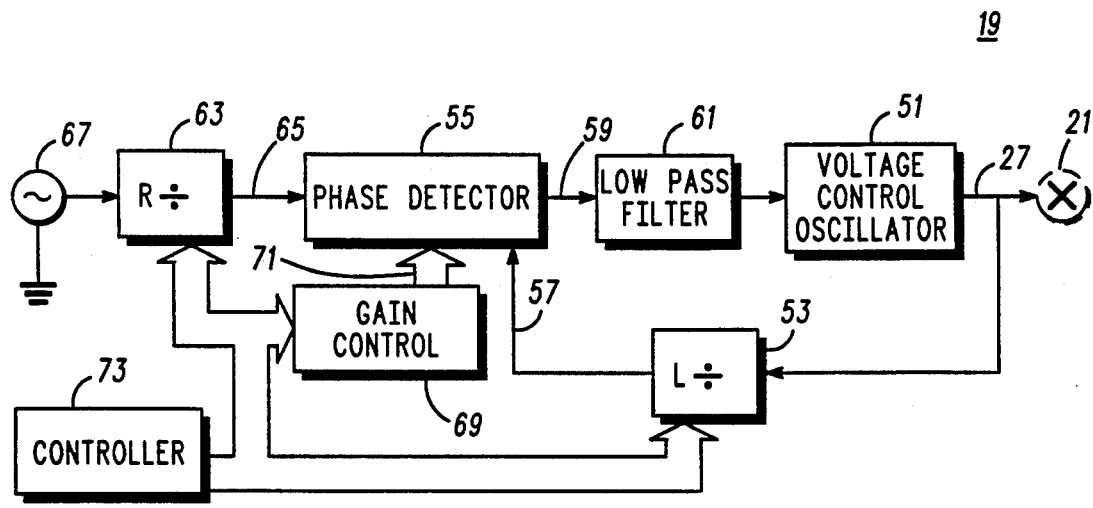
FIG. 2 is a block diagram of a frequency synthesizer constructed in accordance with the instant invention that may be used in the FIG. 1 communications receiver.

The FIG. 2 synthesizer (19) is arranged in a phase locked loop fashion and provides a local oscillator signal with the preselected frequency within a controlled lock time from a voltage controlled oscillator (51). As depicted in FIG. 2, the local oscillator signal is coupled to a loop divider (53) and, from above, the input (27) of the mixer (21). The loop divider (53) divides the local oscillator frequency (VCO frequency) down to a loop frequency, which thus corresponds to the VCO frequency and hence the preselected frequency after lock has been acquired, and couples a feedback signal with the loop frequency, to a phase detector (55) at feedback input (57).

The phase detector (55) provides an error signal that is coupled from an output (59) to a loop filter (61). The error signal is proportional to a controllable gain of the phase detector (55) and corresponds to a phase difference between the feedback signal and a reference signal. The reference signal is coupled from a reference divider (63) to a input (65) of the phase detector (55). The reference divider (63) provides the reference signal by dividing the frequency of a signal from a reference oscillator (67) down to the reference signal's frequency. The loop filter (61) processes the error signal and the result is coupled to and determines the frequency of the voltage controlled oscillator (51).

As is well understood in the art. when lock has been acquired the loop frequency will equal the reference signal's frequency. Furthermore while locked, the phase difference between the feedback signal and the reference signal, assuming characteristics such as phase detector and VCO gain are invariant, will be constant and just sufficient to also maintain other parameters within the synthesizer (19), such as the preselected frequency, at fixed values. Therefore an important feature of the instant invention focuses on controlling the time required for acquisition of lock to the ultimate end of shortening this lock time. With that accomplished, the time that will lapse before the synthesizer (19) provides the local oscillator signal with the preselected frequency, i.e. the receiver (11) provides a received signal, is controlled.

In FIG. 2 this controlled time benefit is effected by a gain control function (69), further explained below, that is coupled to the phase detector (55) at a controllable gain input (71). In a preferred embodiment a microprocessor (not specifically shown) based controller (73) provides programming for the reference divider (63) and the loop divider (53) plus provides various programming functions for the gain control function (69). With this arrangement when the synthesizer (19) is reprogrammed to effect a frequency change, the controller (73) may also trigger and execute the gain control function and thus advantageously allow the synthesizer (19) to realize the preselected frequency within a controlled time.

Figure 3:
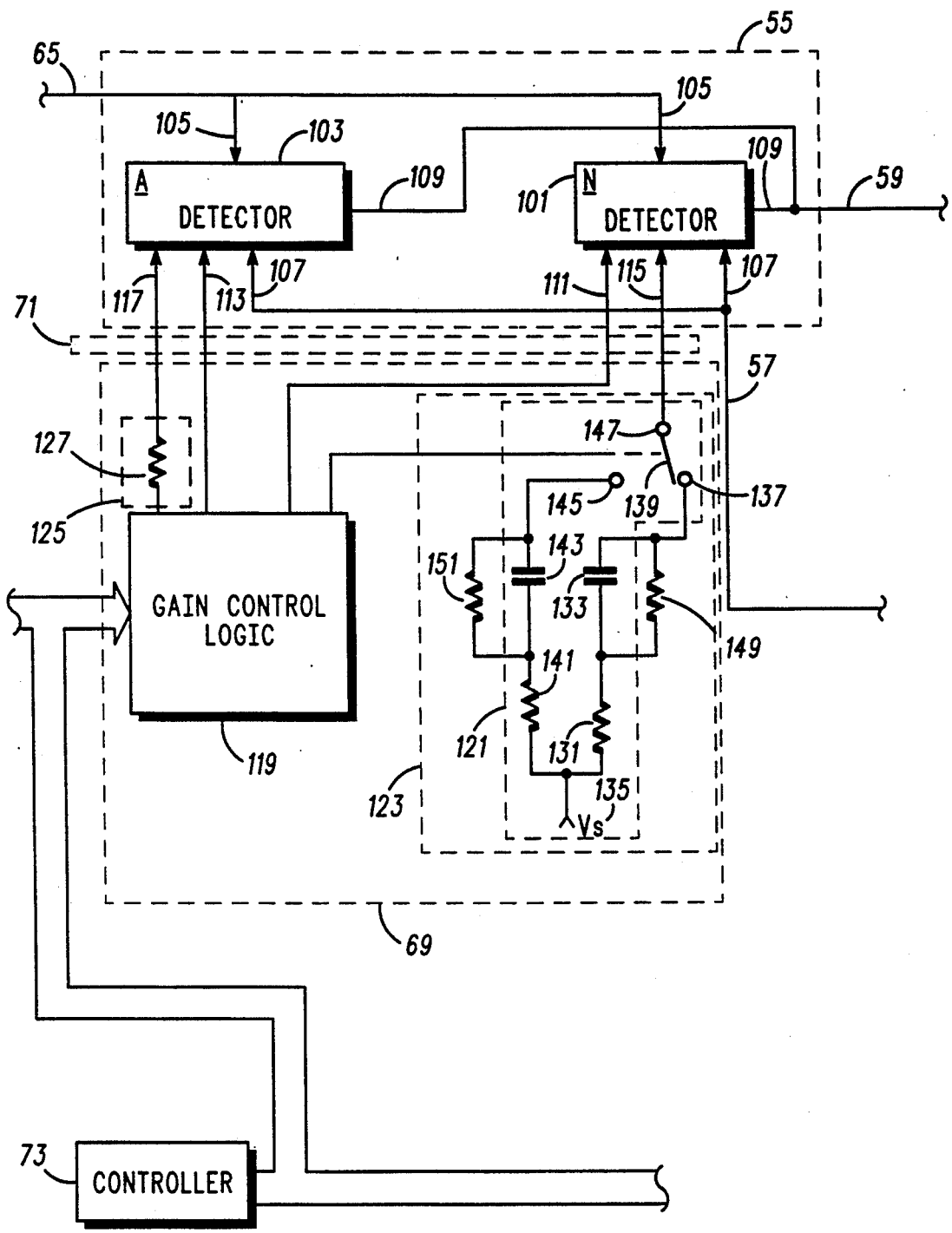
FIG. 3 is a block diagram of a phase detector constructed in accordance with the instant invention that may be employed in the FIG. 2 frequency synthesizer.

Referring to the FIG. 3 detailed diagram of the phase detector (55), including the associated gain control function (69) and the controller (73), all like elements from FIG. 2 and FIG. 1 are referenced by like reference numerals. From FIG. 2, the phase detector (55) includes a normal detector (101) and an acquisition detector (103). Each detector has a reference input (105) coupled to the reference signal at the input (65), a feedback input (107) coupled to the feedback signal at the input (57), and an error output (109) coupled to output (59). The normal and acquisition detectors (101, 103) each have an enable input, respectively, (111, 113) and a gain control input, respectively, (115, 117) wherein such inputs are, together, included in the controllable gain input (71) and hence coupled to the gain control function (69).

Generally each detector is arranged to provide a current pulse at output (109) in a manner such as will establish or maintain the synthesizer (19) in a locked state. This current pulse will have a polarity, i.e. positive or negative implying a current source or sink, that depends on whether the phase comparison of the reference signal and the feedback signal indicates a leading or lagging phase condition. This current pulse will have a duration that depends on the duration or extent of the phase difference between the reference signal and the feedback signal. Finally, this current pulse will have a magnitude that depends on a setting of the controllable gain of the detectors (101, 103) as applied to the respective gain control inputs (115, 117).

In practice and similar to other synthesizers the acquisition detector (103) will operate for a relatively short time period at a comparatively high gain whenever the synthesizer must provide a different preselected frequency that differs a significant amount from it's present state. In practice and similar to other synthesizers the normal detector (101) will operate with a comparatively low detector gain so long as the synthesizer (19) is expected to maintain the preselected frequency. However, in contrast to other synthesizers as further explained below, the instant invention in a novel and advantageous manner provides a predetermined and controlled detector gain during the requisite transition time between operation of the acquisition detector (103) and operation of the normal detector (101) to maintain the preselected frequency.

In a preferred embodiment, the gain of the detectors is set or controlled by a bias current as applied to the gain control inputs (115, 117). Internal to the detector this bias current, via a current mirror arrangement, establishes the operating current and therefore gain of an amplifier stage. This gain, in turn, controls the magnitude of the current pulse when such pulse is provided at output (109). Thus a signal, indicative of the phase comparison (difference) applied to the amplifier stage, when enabled at enable inputs (111, 113), will be amplified by an amount proportional to or controlled by the bias current applied to the gain control inputs (115, 117) and will result in a current pulse at output (109) with a magnitude proportional to such bias current.

The gain control function (69) includes a control circuit (119) that is coupled to the controller (73) and the enable inputs (111, 113). Further included and coupled to the control circuit (119) is an adapt circuit (121), a tracking circuit (123), and an acquisition circuit (125). The adapt circuit (121) and the tracking circuit (123) are coupled to the normal detector (101) at the gain control input (115). The acquisition circuit (125) including, in a preferred embodiment, a resistive element (127) is coupled to the acquisition detector (103) at the gain control input (117).

The adapt circuit (121) is for setting the controllable gain of the normal detector to an adapt value. The tracking circuit (123) is for setting the controllable gain of the normal detector to a tracking value by adjusting the controllable gain of the phase detector (55) in a predetermined and controlled fashion from the adapt value to the tracking value. This predetermined and controlled fashion will be determined by the practitioner in view of particular circumstances such as desired performance criteria, available synthesizer configurations, or phase detector properties and may be, for example, a series of steps, a substantially continuous and monotonic function, or a decreasing exponential curve as herein disclosed in a preferred embodiment. The acquisition circuit (125) is for setting the acquisition detector gain to an acquisition value. This may be particularly useful in those circumstances, such as a preferred embodiment, where the synthesizer (19) characteristics and capabilities allow the practitioner to take advantage of this feature.

The adapt circuit includes a first combination of a series connected resistor (131) and a capacitor (133) coupled between a voltage source (135) and a first terminal (137) of a switch (139). Further included is a second combination of a series connected resistor (141) and a capacitor (143) connected between the voltage source (135) and a second terminal (145) of a switch (139). Lastly a switched terminal (147) of switch (139) is coupled to gain control input (115). In a preferred embodiment the tracking circuit (123) is similar to the adapt circuit (121) with the addition of resistors (149, 151), respectively, connected in parallel with capacitors (133, 143).

Figure 4:
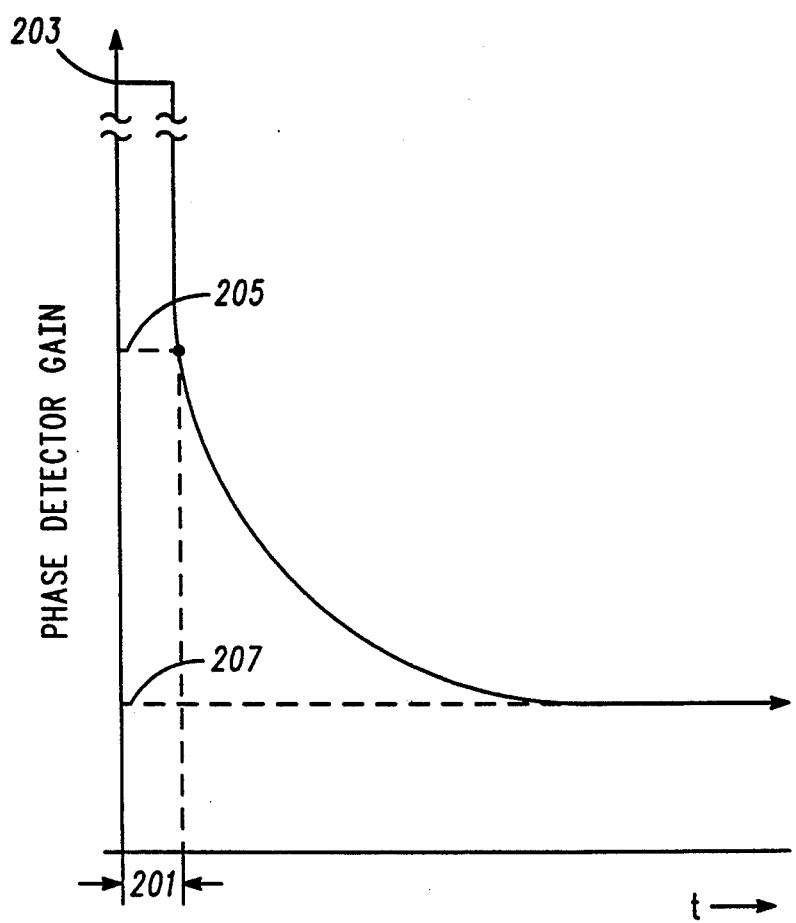
FIG. 4 is an exemplary diagram of the gain of the phase detector of FIG. 3 as a function of time.

With the above in mind and additionally referring to FIG. 4, operation of the synthesizer (19), more specifically phase detector (55) together with gain control (69), in the context of providing a preselected frequency, or acquiring lock from an initial unlocked state, such as may occur when the preselected frequency in changed or when the synthesizer is initially enabled, may be further appreciated in view of the following description. Initially, in response to controller (73), acquisition detector (103) is enabled and the acquisition circuit (125) is activated by gain control function (119). This is accomplished by, respectively, supplying a signal at enable input (113) and a voltage to resistive element (127). This corresponds in FIG. 4 to time period (201) and the phase detector's (55) controllable gain being set to the acquisition value (203).

When the time period (201) lapses, the gain control function disables the acquisition detector (103), enables the normal detector (101) via enable input (111), and toggles the switch (139) thereby allowing the adapt circuit (121) to set the controllable gain of the phase detector (55). The controllable gain will be set to an adapt value (205) that corresponds to a bias current equivalent to the voltage source (135) divided by resistor (131 or 141) depending on the position of switch (139).

In the preferred embodiment, the tracking circuit (123) then sets the controllable gain to the tracking value (207) by adjusting the controllable gain in a predetermined and controlled fashion asymptotically toward the tracking value (207) where it will remain until otherwise indicated. The predetermined and controlled fashion here is a continuous and monotonically decreasing exponential function with specific parameters determined by the resistors (131 and 149) and capacitor (133) for the indicated position of switch (139). The tracking value (207) is the voltage source (135) divided by the summation of resistors (131 and 149), again for the indicated position of the switch (139). Similar operation is effected with the switch (139) toggled to the alternative terminal (145). Furthermore with the switch (139) in the indicated position capacitor (143) may discharge through resistor (151) thereby preparing that portion of the tracking circuit for proper operation when the switch (139) is again toggled.

A preferred embodiment of an inventive solution to the trade off between lock time and noise performance often encountered in frequency synthesizers has been disclosed. The disclosure teaches a straight forward apparatus and method whereby a phase detector gain is continuously controlled to effect a controlled lock time and yet yield the noise performance that may be expected of synthesizers by practitioners in the art.

I claim:

1. A frequency synthesizer arranged in a phase locked loop fashion to provide an output signal with a preselected frequency within a controlled lock time from a voltage controlled oscillator, comprising:

phase detector means having a controllable gain, for providing an error signal that is proportional to said controllable gain and that corresponds to a phase difference between a reference signal and a feedback signal, said error signal as processed determining the preselected frequency of the voltage controlled oscillator, said feedback signal corresponding to the preselected frequency;

adapt means, coupled to said phase detector means, for setting said controllable gain to an adapt value; and tracking means, coupled to said phase detector means, for setting said controllable gain to a tracking value by adjusting said controllable gain in a substantially continuous and monotonic fashion from said adapt value to said tracking value.

2. The frequency synthesizer of claim 1 wherein said substantially continuous and monotonic fashion is a decreasing exponential function.

3. The frequency synthesizer of claim 1 further including acquisition means, coupled to said phase detector means, for setting said controllable gain to a lock acquisition value.

4. The frequency synthesizer of claim 3 further including control means, coupled to said adapt means and said acquisition means, for controlling said adapt means and said acquisition means.

5. The control means of claim 4 further controlling when said adapt means and said acquisition means set said controllable gain, respectively, to said adapt value and said acquisition value.

6. The frequency synthesizer of claim 4 wherein said substantially continuous and monotonic fashion is a decreasing exponential function.

7. A frequency synthesizer arranged in a phase locked loop fashion to provide an output signal with a preselected frequency within a controlled lock time from a voltage controlled oscillator, comprising:

phase detector means having a controllable gain, for providing an error signal that is proportional to said controllable gain and that corresponds to a phase difference between a reference signal and a feedback signal, said error signal as processed determining the preselected frequency of the voltage controlled oscillator, said feedback signal corresponding to the preselected frequency;

adapt means, coupled to said phase detector means, for setting said controllable gain to an adapt value; and tracking means, coupled to said phase detector means, for setting said controllable gain to a tracking value by adjusting said controllable gain in a predetermined and controlled fashion from said adapt value to said tracking value.

8. The frequency synthesizer of claim 7 wherein said predetermined and controlled fashion is a continuously decreasing function.

9. The frequency synthesizer of claim 7 further including acquisition means, coupled to said phase detector means, for setting said controllable gain to a lock acquisition value.

10. The frequency synthesizer of claim 9 further including control means, coupled to said adapt means and said acquisition means, for controlling said adapt means and said acquisition means.

11. The control means of claim 10 further controlling when said adapt means and said acquisition means set said controllable gain, respectively, to said adapt value and said acquisition value.

12. The frequency synthesizer of claim 10 wherein said predetermined and controlled fashion is a continuously decreasing function.

13. In a frequency synthesizer arranged in a phase locked loop fashion to provide an output signal with a preselected frequency within a controlled lock time from a voltage controlled oscillator, a method including the steps of:

providing an error signal that is proportional to a controllable gain and that corresponds to a phase difference between a reference signal and a feedback signal, said error signal as processed determining the preselected frequency of the voltage controlled oscillator, said feedback signal corresponding to the preselected frequency;

setting said controllable gain to an adapt value; and setting said controllable gain to a tracking value by adjusting said controllable gain in a predetermined and controlled fashion from said adapt value to said tracking value.

14. The method of claim 13 wherein said predetermined and controlled fashion is a continuously decreasing function.

15. The method of claim 13 further including the step of setting said controllable gain to a lock acquisition value.

16. The method of claim 15 further including controlling when said controllable gain is set, respectively, to said adapt value and said lock acquisition value.

17. The method of claim 16 wherein said predetermined and controlled fashion is a continuously decreasing function.

18. A communications receiver arranged to receive radio signals within a controlled time, comprising:

receiver means for mixing a radio signal and a local oscillator signal to provide a received signal when said local oscillator signal has a preselected frequency;

synthesizer means, coupled to said receiver means and arranged in a phase locked loop fashion, for providing said local oscillator signal with said preselected frequency within a controlled lock time from a voltage controlled oscillator, said synthesizer means further including;

phase detector means having a controllable gain, for providing an error signal that is proportional to said controllable gain and that corresponds to a phase difference between a reference signal and a feedback signal, said error signal as processed determining said preselected frequency of said voltage controlled oscillator, said feedback signal corresponding to said preselected frequency;

adapt means, coupled to said phase detector means, for setting said controllable gain to an adapt value; and tracking means, coupled to said phase detector means, for setting said controllable gain to a tracking value by adjusting said controllable gain in a predetermined and controlled fashion from said adapt value to said tracking value.

19. The communications receiver of claim 18 wherein said predetermined and controlled fashion is a continuously decreasing function.

20. The communications receiver of claim 18 further including control means, coupled to said adapt means and said acquisition means, for controlling said adapt means and said acquisition means.

* * * * *